United States Patent [19]

Hosoda et al.

[11] Patent Number: 4,798,950

[45] Date of Patent: Jan. 17, 1989

[54] RADIATION CHARACTERISTIC MEASURING APPARATUS FOR LASER DIODE

[75] Inventors: Takuya Hosoda; Shoji Adachi; Atsushi Kudo, all of Tokyo, Japan

[73] Assignee: Ando Electric Co., Ltd., Tokyo, Japan

[21] Appl. No.: 904,122

[22] Filed: Sep. 4, 1986

[30] Foreign Application Priority Data

Sep. 5, 1985 [JP] Japan .................. 60-196757

[51] Int. Cl.$^4$ .................................................. H01J 40/14
[52] U.S. Cl. .................................. 250/214 A; 356/224
[58] Field of Search ................ 356/218, 224; 250/206, 250/214 R, 214 A, 214 C, 205; 324/158 D

[56] References Cited

U.S. PATENT DOCUMENTS 3,687,558  8/1972  Rex ........................... 356/224
4,459,475  7/1984  Flint et al. ................. 250/214 A Primary Examiner—David C. Nelms
Attorney, Agent, or Firm—Seidel, Gonda, Goldhammer & Abbott

[57] ABSTRACT

An apparatus for measuring a radiation characteristic of a laser diode. An AC signal and a step-like DC voltage are applied to the laser diode and the radiant power output thereof is received by a photodiode having an output to which a first amplifier, a transformer, a capacitor and an AC amplifier for extracting the AC signal. The apparatus further comprises a first switch connected between the input of the first amplifier and the capacitor, and a second switch connected between both ends of the transformer. Every time the step-like voltage is stepped up, the first and second switches are closed for a short time as compared with the duration of a step period to protect the measurement from the influence of the change in the DC voltage.

2 Claims, 1 Drawing Sheet

RADIATION CHARACTERISTIC MEASURING APPARATUS FOR LASER DIODE

BACKGROUND OF THE INVENTION

1. Field of the Invention

The present invention relates to an apparatus for measuring radiation characteristic of a laser diode. More particularly, the invention concerns a radiation characteristic measuring apparatus which is protected from the influence of change in a DC (direct current) voltage upon measurement of differentiated characteristic of a laser diode by applying thereto an AC (alternating current) voltage in superposition to a step-like DC (direct current) voltage.

2. Description of the Prior Art

FIG. 2 of the accompanying drawings shows a radiant-power or photo-output versus excitation- or drive-current characteristic of a laser diode. This characteristic curve provides a criterion for deciding whether a laser diode in concern is to be satisfactory or not in respect to the characteristic. More specifically, when the characteristic curve as measured is of a form fluctuating unnaturally, it may be decided that the laser diode in concern has poor characteristic. Accordingly, decision as to whether a laser diode is to be satisfactory or not in respect to the characteristic may be realized by differentiating a signal representative of the characteristic curve illustrated in FIG. 2. In a practical application, the differentiation may be carried out by applying a stepwise increasing DC voltage to the laser diode and measuring the radiant power output thereof. When the signal derived through the differentiation represents a uniformly increasing curve, it may be decided that the diode as tested is of a good quality, while fluctuation present in the curve resulting from the differentiation will means that the laser diode in concern is not to be satisfactory in respect to the characteristic in concern. It is however noticed that a problem is often encountered in making the decision mentioned above because the data obtained through differentiation is often of so small magnitude that discrimination is rendered very difficult. In an attempt to avoid such difficulty, it has been proposed to apply an AC voltage to the laser diode under test in super-position to the DC voltage, wherein the differential measurement is performed by amplifying the AC voltage from the laser diode. In that case, however, when a step-like DC voltage is employed, data as obtained undergoes a change every time the DC voltage changes stepwise, making it difficult to discriminate whether the detected data increases uniformly or suffers fluctuation.

SUMMARY OF THE INVENTION

It is therefore an object of the present invention to provide an apparatus for measuring a radiant-power-output versus excitation current characteristic of a laser diode by employing an AC voltage in superposition to a step-like DC voltage, which apparatus is substantially insusceptible to the influence of the step-like DC voltage.

In view of the above object, there is provided according to an aspect of the present invention an apparatus for measuring a radiation characteristic of a laser diode, in which an AC voltage and a step-like DC voltage are applied to the laser diode whose radiant power output is received by a photodiode having an output to which a first amplifier, a transformer, a capacitor and an AC amplifier for extracting the AC signal are connected, which apparatus further comprises a first switch connected between the input of the first amplifier and the capacitor, and a second switch connected between both ends of the transformer, wherein every time the step-like voltage is stepped up, the first and second switches are closed for a short time as compared with the duration of a step period of the step-like DC voltage. With the arrangement of the invention described above, the measurement can be protected from adverse influence of the change in the DC voltage and can be performed with an improved reliability.

The above and other objects, features and advantages of the present invention will become apparent upon reading the following description of the preferred embodiments of the invention taken in conjunction with the accompanying drawings.

DESCRIPTION OF THE PREFERRED EMBODIMENT

Now, the invention will be described in detail by referring to FIG. 1 which shows an exemplary embodiment of the invention.

Figure 1:
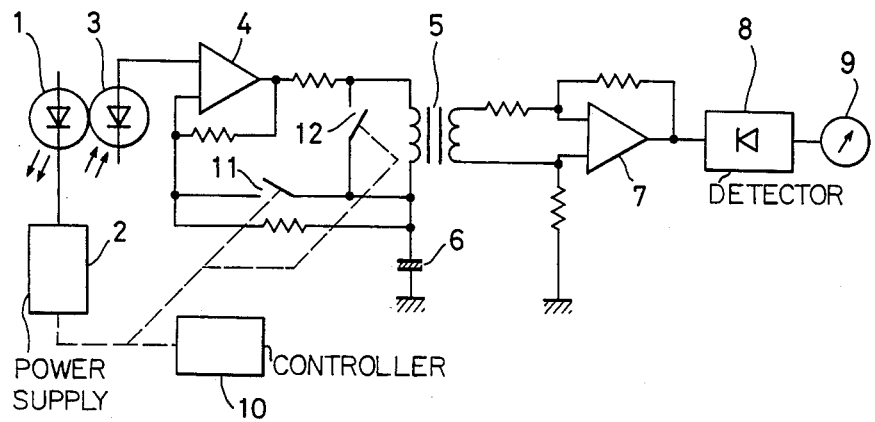
FIG. 1 is a circuit diagram showing a general arrangement of the laser diode radiation characteristic measuring apparatus according to an embodiment of the invention.
Figure 2:
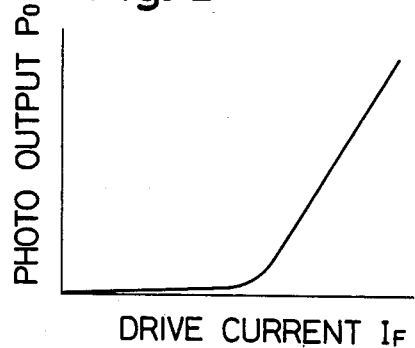
FIG. 2 is a view illustrating graphically a radiant power or photo output characteristic of a laser diode.

In FIG. 1, a reference numeral 1 denotes a laser diode whose radiation characteristic is to be measured, a numeral 2 denotes a power supply source, 3 denotes a photodiode, 4 denotes an amplifier, 5 denotes a transformer, 6 denotes a capacitor, 7 denotes an AC amplifier, 8 denotes a detector, 9 denotes an indicator, 10 denotes a controller, and numerals 11 and 12 denotes switches, respectively. Each of the switches 11 and 12 may be constituted by an analogue switch.

The power supply source 2 is so arranged as to apply an AC voltage and a step-like DC voltage to the laser diode 1 under test. The radiant power output of this laser diode is detected by the photodiode 3. The output signal of the photodiode 3 is sent to the transformer 5 after having been amplified through the amplifier 4. The capacitor 6 serves to remove the DC component so that only the AC signal is derived from the secondary of the transformer 5. The AC signal thus derived is then amplified through the AC amplifier 7 to be subsequently detected by the detector 8. Since the indicator 9 is supplied with the AC signal corresponding to the AC voltage applied to the laser diode 1, the differential characteristic in concern of the laser diode 1 can be determined on the basis of the values indicated by the indicator 9.

Figure 3:
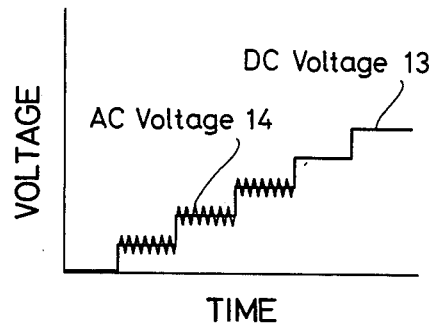
FIG. 3 is a view illustrating graphically a voltage characteristic of a power supply source (2) of the apparatus shown in FIG. 1.

FIG. 3 graphically shows the output characteristic of the power supply source 2. As will be seen in the figure, a step-like DC voltage 13 is superposed with an AC voltage 14. It will be understood that the power supply source 2 is adapted to apply to the laser diode 1 the combined voltage which varies as a function of time lapse in the manner illustrated in FIG. 3 under the control of the controller 10.

The switches 11 and 12 are interlocked with each other and adapted to be opened (off) and closed (on) under the command of the controller 10.

Turning to FIG. 1, the switch 11 is disposed to connect one input of the amplifier 4 to the capacitor 6, while the switch 12 is inserted between both ends of the primary winding of the transformer 5.

Figure 4:
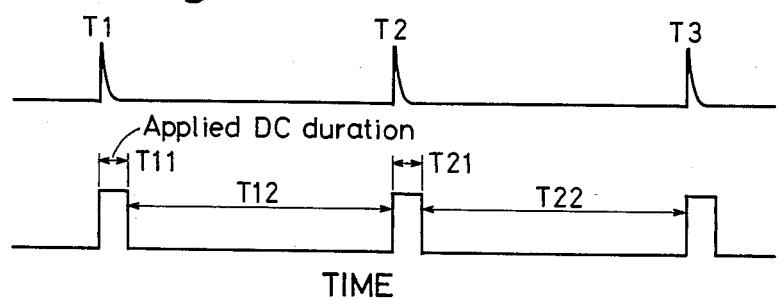
FIG. 4 is a view for illustrating an on/off operation of switches (11, 12) employed in the apparatus shown in FIG. 1.

Operations of the switches 11 and 12 are illustrated in FIG. 4. In the figure, reference symbols T1, T2 and T3 represent clock pulses generated by the controller 10. Under the timing of this clock signal, the DC voltage is increased stepwise as illustrated in FIG. 3. More specifically, a time interval between the clock pulses T1 and T2 corresponds to a step period of the DC voltage 13 shown in FIG. 3. Both the switches 11 and 12 are simultaneously closed in response to each of the clock pulses T1, T2, and T3 and remained in the closed or on-state for a time shorter than the one step period and again opened. By way of example, assuming that the step period of the clock signal is 1 ms, both the switch 11 and 12 are closed for 40 µs.

By closing the switch 11 for a period represented by T11, T21, the DC voltage is applied to the capacitor 6 which is thus charged with the DC voltage. Since the switch 12 is closed whenever the capacitor 6 is charged through the closed switch 11, a short-circuit is formed between both ends of the primary of the transformer 5 by the switch 12, resulting in that the AC signal is interrupted.

The time intervals T12 and T22 in FIG. 4 correspond to the measuring periods, respectively, during which the DC voltage is applied to the capacitor 6 so that no charging current flows therein.

In this manner, only the AC voltage component 14 superposed on the DC voltage 13 as illustrated in FIG. 3 can be extracted in a stabilized state during the measuring periods T12 and T22 to be utilized in the measurement of the differentiated radiation characteristic of the laser diode 1.

As will now be appreciated from the foregoing description by virtue of such arrangement that the DC voltage is applied to the DC cut-off capacitor 6 for a short time through the switch 11 every time the DC voltage changes while a shortcircuit is formed between both ends of the primary circuit of the transformer 5 by means of the switch 12 for the same time, the AC signal superposed on the DC voltage can be detected without undergoing influence of the step-like change in the DC voltage, whereby the differentiated characteristic in concern of the laser diode can be measured in the stabilized state.

In the foregoing, the present invention has been described in conjunction with an embodiment thereof. It should however be understood that the invention is never restricted exactly to the disclosure made herein. Many modifications and versions will readily occur to those skilled in the art without departing from the spirit and scope of the invention set forth in claims.

We claim:

1. Apparatus for measuring a radiation characteristic of a laser diode, in which an ac signal and a step-like dc voltage are applied to the laser diode and in which the radiant power output of said laser diode is received by a photodiode, comprising:
   a first amplifier having two inputs one of which is connected to the output of the photo diode for amplifying the output signal of said photo diode;
   a transformer including primary and secondary windings for extracting said ac signal, said primary winding being connected in series with the output of said first amplifier;
   a capacitor connected in series with the preliminary winding;
   an ac amplifier connected across the secondary winding of the transformer for amplifying ac signals derived from the secondary of the transformer;
   a first switch connected to the other input of the first amplifier and to a junction between the primary winding of the transformer and the capacitor; and
   a second switch connected across the primary winding of a transformer and to the junction between the first switch and the capacitor; and
   means for applying a stepped dc voltage signal superimposed with an ac signal to said laser diode for predetermined step periods and for simultaneously closing said first and second switches for a shorter time period than individual step periods thereby applying the dc voltage to the capacitor to charge it while the primary circuit of the transformer is short circuited.

2. Apparatus for measuring a radiation characteristic of a laser diode according to claim 1, further including a power supply source for applying said ac signal and said dc voltage signal to said laser diode and a controller for controlling said power supply source and for controlling the simultaneous closings of said first and second switches and the extraction of ac voltage from the transformer.

* * * * *